(12) United States Patent
Quintero Colmena et al.

(10) Patent No.: US 11,973,118 B2
(45) Date of Patent: Apr. 30, 2024

(54) METHOD FOR FORMING OHMIC CONTACTS, PARTICULARLY OF NI(GESN) TYPE IMPLEMENTING LASER ANNEALING

(71) Applicant: COMMISSARIAT A L'ENERGIE ATOMIQUE ET AUX ENERGIES ALTERNATIVES, Paris (FR)

(72) Inventors: Andréa-Carolina Quintero Colmena, Grenoble (FR); Pablo Acosta Alba, Grenoble (FR); Philippe Rodriguez, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 260 days.

(21) Appl. No.: 17/443,842

(22) Filed: Jul. 28, 2021

(65) Prior Publication Data
US 2022/0037477 A1 Feb. 3, 2022

(30) Foreign Application Priority Data
Jul. 31, 2020 (FR) .................................. 20 08175

(51) Int. Cl.
*H01L 29/40* (2006.01)
*H01L 21/285* (2006.01)
*H01L 21/321* (2006.01)

(52) U.S. Cl.
CPC ...... *H01L 29/401* (2013.01); *H01L 21/28568* (2013.01); *H01L 21/321* (2013.01)

(58) Field of Classification Search
None
See application file for complete search history.

(56) References Cited

U.S. PATENT DOCUMENTS

| 6,066,516 | A | 5/2000 | Miyasaka |
| 6,365,446 | B1 * | 4/2002 | Chong ............. H01L 21/26506 438/662 |
| 9,490,128 | B2 | 11/2016 | Wang et al. |
| 9,608,166 | B2 | 3/2017 | Slater, Jr. et al. |

FOREIGN PATENT DOCUMENTS

EP 2763159 * 6/2014 ........... H01L 21/285

OTHER PUBLICATIONS

French Preliminary Search Report dated Apr. 13, 2021 in French Application 20 08175 filed on Jul. 31, 2020, 8 pages (with English Translation of Categories of Cited Documents & Written Opinion).
Schulte-Braucks et al., "Schottky barrier tuning via dopant segregation in NiGeSn—GeSn contacts", Journal of Applied Physics, vol. 121, No. 20, 2017, 8 pages.

(Continued)

*Primary Examiner* — Alexander G Ghyka
(74) *Attorney, Agent, or Firm* — Oblon, McClelland, Maier & Neustadt, L.L.P.

(57) ABSTRACT

The invention relates to a method for producing ohmic contacts, of type including a metal, a semiconductor and tin, including:

a) forming a first layer (6), of an alloy of the semiconductor and of tin;
b) then, on the first layer, forming a second layer (8), of said metal;
c) laser annealing the first layer and the second layer at an energy density between 0.1 and 2 J/cm$^2$.

18 Claims, 10 Drawing Sheets

(56) References Cited

OTHER PUBLICATIONS

Huet et al., "Laser thermal anneal formation of atomically-flat low-resistive germanide contacts", Phys. Status Solidi C, vol. 11, No. 1, 2014, pp. 169-173.
Chen et al., "Nickel Silicide Formation using Pulsed Laser Annealing for nMOSFET, Performance Improvement", Journal of The Electrochemical Society, 158 (8), 2011, 7 pages.

* cited by examiner

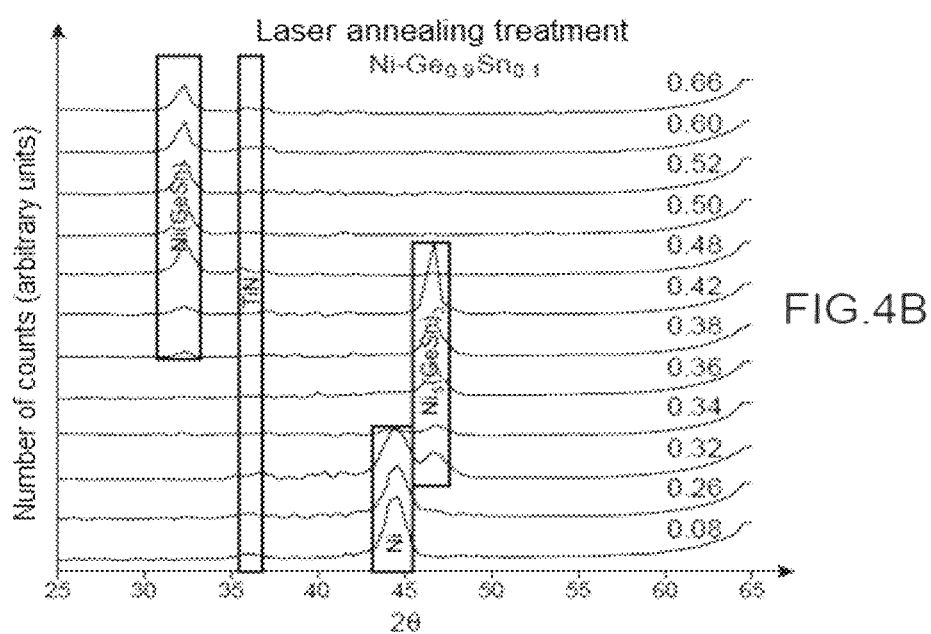

METHOD FOR FORMING OHMIC CONTACTS, PARTICULARLY OF NI(GESN) TYPE IMPLEMENTING LASER ANNEALING

TECHNICAL FIELD AND PRIOR ART

The invention relates to the production or the making of ohmic contacts, particularly of Ni(GeSn) (nickel, germanium and tin alloy) type.

It is applicable in the field of semiconductor materials, electronic devices and optoelectronic devices.

The known development of an intermetallic contact of Ni(GeSn) type implements a rapid thermal annealing (RTA) treatment, at temperatures between 200 and 350° C., for an annealing time between 30 and 60 seconds. However, a high density of defects and a low thermal stability of layers obtained by this type of method is noted, which results in the agglomeration of Ni(GeSn) and the segregation of tin (Sn). This is in particular the case for temperatures close to 350° C., which may be significantly detrimental to the electrical, but also optical properties.

In the case of optical devices, the agglomeration of tin (Sn) poses the additional problem that the optical properties are affected. For example, GeSn is used as emitting layer in laser devices. The addition of tin into germanium makes it possible to modify the band properties of the latter and make the gap direct. Yet the agglomeration of tin (Sn) modifies the composition of the GeSn layer (it then tends towards pure germanium) and thus modifies the properties of the electronic bands.

Rapid thermal annealing (or "RTA") treatment therefore does not make it possible to obtain an ohmic contact of Ni(GeSn) type of satisfactory quality (these contacts lack thermal stability), having suitable electrical qualities (low resistivity and low sheet resistance ($R_{sh}$)) and/or optical qualities.

Therefore, the problem arises of finding a novel method for producing ohmic contacts of Ni(GeSn) type, having satisfactory electrical and/or optical properties. In particular, such a method prevents the segregation of Sn atoms and improves the thermal stability of the device.

DESCRIPTION OF THE INVENTION

The object of the invention is firstly a method for producing or for making ohmic contacts including, or consisting of, a metal, a semiconductor and tin, the concentration of which is preferably lower than 20%, implemented by laser annealing.

According to a first aspect of the invention, such a method includes:
 a) forming a first layer, of an alloy of the semiconductor and of tin;
 b) then, on the first layer, forming a second layer of said metal;
 c) laser annealing the first layer, for example at an energy density that may be between 0.1 and 0.8 J/cm² or even between 0.1 and 2 J/cm².

The semiconductor material may be silicon or germanium.

The metal is for example selected from nickel (Ni), cobalt (Co), titanium (Ti), platinum (Pt), nickel-platinum (NiPt) alloy, nickel-cobalt (NiCo) alloy, tantalum (Ta), tantalum nitride (TaN), titanium nitride (TiN), aluminium (Al), zirconium (Zr), ytterbium (Yb).

In the case of the Ni/GeSn system, the method according to the invention makes it possible to obtain a low resistive nickel, germanium and tin (Ni(GeSn)) phase, with very good electrical properties and without segregation of tin (Sn) atoms, the thermal stability of the contact being improved in relation to that resulting from a RTA type treatment. Advantageously, such a method further includes, after step b) and before step c), forming a low resistive metal layer of protection and of absorption of the laser beam, for example made of titanium nitride (TiN) or made of tantalum nitride (TaN).

The first layer, made of an alloy of the semiconductor and of tin, may be obtained by epitaxial growth on a substrate of said semiconductor.

The energy density of the laser may for example be between 0.45 and 0.66 J/cm² or 0.7 J/cm².

A method according to the invention may further include, after step c), a step of rapid thermal annealing, preferably at low temperature, for example at a temperature between 150° C. and 250° C.

Advantageously, such a method includes, between steps a) and b), a step of amorphising the first layer.

This amorphisation step may be obtained by implantation of one or more atomic species, for example carbon (C) and/or germanium (Ge) and/or silicon (Si).

Step c) of laser annealing may be performed with the aid of a pulse laser, of wavelength lower than 450 nm and/or of pulse width between 10 ns and 300 ns. The desired energy density may be deposited in one or more pulses. Alternatively, this step c) of laser annealing may be performed with the aid of a continuous laser, of wavelength lower than 450 nm.

A method according to the invention may further include, before step b), a step of doping the first layer, and optionally the substrate of said semiconductor. In the case of a first GeSn layer, optionally on a germanium substrate, the GeSn layer, and optionally the germanium layer, may be doped, for example by boron or phosphorus, A method according to the invention may further include a preliminary step of determining or estimating the melting limit or temperature of the alloy of the semiconductor and of tin, melting limit or melting temperature that it is desired to reach by laser annealing.

The first layer, of an alloy of the semiconductor and of tin, and optionally said semiconductor substrate, may be produced on a silicon substrate, this substrate forming for example part of an optical component or of a CMOS device.

BRIEF DESCRIPTION OF THE DRAWINGS

Examples of embodiment of the invention will now be described with reference to the appended drawings wherein:

FIGS. 4A and 4B show diffraction measurements for a Ni/GeSn system treated at various temperatures by conventional RTA type annealing (FIG. 4A) and at various energy densities by laser annealing (FIG. 4B).

In the figures, similar or identical elements are designated by the same reference numbers.

DETAILED DESCRIPTION OF EMBODIMENTS

Figure 1A:
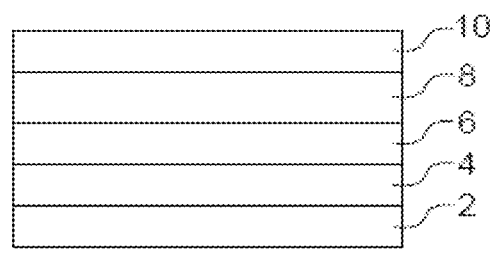
FIGS. 1A and 1B show an example of method according to the invention.
Figure 1B:
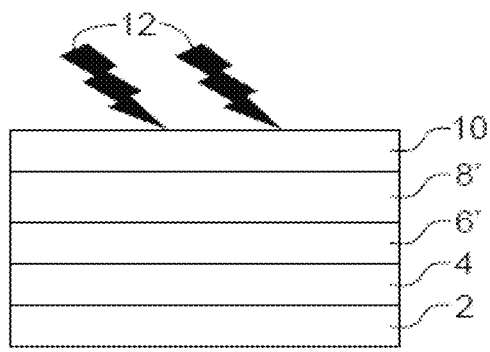

One example of embodiment of a method according to the invention is shown in FIGS. 1A and 1B, for producing a Ni(GeSn) ohmic contact.

A stack comprising a germanium-tin (GeSn) alloy layer 6 and a nickel (Ni) layer 8 is first produced on a substrate 2, for example made of silicon (FIG. 1A) this substrate 2 able to be for example made of solid silicon or a SOI (Silicon on Insulator) and able to form part of the component on which such a contact is produced.

The germanium-tin (GeSn) alloy layer 6, of thickness for example between 10 nm and 1 µm, may be produced by epitaxy on a germanium layer 4 (of thickness of a plurality of µm, for example between 2 µm and 10 µm, for example also 2.5 µm), itself supported by the silicon substrate 2. The tin concentration in the germanium is for example approximately 10%, more generally between 2% and 20% or also between 8% and 15% (particularly for optical applications, such as a GeSn laser).

The layer 6 and the layer 4 may be doped, for example by boron or phosphorus, for example also at a dose between $10^{18}$ and $10^{20}$ at/cm³, for example $10^{19}$ at/cm³.

The nickel (Ni) layer 8 may have a thickness of a plurality of nm or of a plurality of tens of nm, for example between 5 nm and 50 nm, for example also of 10 nm.

The assembly is topped with a metal layer 10, for example made of titanium nitride (TiN) or tantalum nitride (TaN). This metal layer 10 has a thickness of a plurality of nm or of a plurality of tens of nm, for example between 5 nm and 50 nm, for example 7 nm. This layer is a protective layer, but it also has the function of absorbing most of the laser beam and the heat deposited by the laser, heat that subsequently diffuses towards the stack, and particularly towards the nickel 8 and germanium-tin (GeSn) layers 6.

This assembly is subjected to annealing with the aid of a laser beam 12 (FIG. 1B), which makes it possible to reach the melting temperature of the alloy concerned, here GeSn. It may be a pulse laser. The energy density deposited is between 0.4 J/cm² and 0.7 J/cm², preferably between 0.48 and 0.66 J/cm². This energy density is measured or estimated in the plane of the upper surface of the layer 10. For example, it may be measured or estimated by deflecting (at each pulse in the case of a pulse laser) a portion of the beam towards a photodiode.

The laser is for example a XeCl laser (308 nm), having pulses of 160 ns (FWHM), having an energy density between 0.08 and 0.66 J/cm².

A single pulse may be implemented to deposit the surface energy density selected; alternatively, a plurality of pulses may be used, to deposit, in total, the same surface energy density as a single pulse or a surface energy density making it possible to obtain results identical or comparable to those obtained with a single pulse. Alternatively, it is possible to use a continuous laser, which irradiates the surface of the metal layer 10 for a duration making it possible to deposit the desired energy density.

The result of the annealing is the structure presented in FIG. 1B, including a nickel, germanium and tin (Ni(GeSn)) layer 8' on top of the germanium-tin (GeSn) layer 6', the latter being of same composition as the initial layer 6, but of lower thickness since a portion of the latter has been consumed.

According to a particular example of embodiment:
- the germanium-tin (GeSn) alloy layer 6 is produced by epitaxy on a germanium (Ge) layer 4, itself produced on a silicon (100) substrate 2, for example the epitaxy of the germanium-tin (GeSn) alloy layer 6 is produced in a RPCVD (Reduced Pressure Chemical Vapour Deposition) apparatus or in a MBE (Molecular Beam Epitaxy) type apparatus;
- then a step of cleaning and of deoxidising may be performed; for example, this layer is quenched for 1 minute in a bath of HF (hydrofluoric acid) diluted at 1% in water; it is subsequently rinsed with the aid of deionised water and dried with a nitrogen gun;
- a step of doping the layer 6 and the layer 4 may be performed, for example by boron or phosphorus, for example also at a dose between $10^{18}$-$10^{20}$ at/cm³, for example $10^{19}$ at/cm³;
- a nickel (Ni) layer 8 is subsequently deposited, followed by an upper layer 10 of a protective material, preferably a metal, such as titanium nitride (TiN) or tantalum nitride (TaN) (of thickness for example of approximately 7 nm), the whole at ambient temperature, by PVD (Physical Vapour Deposition) or EBE (Electron Beam Evaporation) technique;
- for example a XeCl laser (308 nm) is used, having pulses of 160 ns (FWHM), with a deposited energy density between 0.08 and 0.66 J/cm².

The properties of such a TiN/Ni/GeSn/Ge/Si stack subjected to laser treatment are studied below. Comparisons are made with a stack subjected to a conventional RTA method.

The melting limit of the semiconductor-tin (GeSn in the example given above) alloy, that it is desired to achieve within the scope of the method according to the invention, may not be known beforehand. This is the case, for example, for a new stack (particularly for a new material and/or a new thickness of one of the layers of the latter). Therefore, a determination or an estimation of this melting limit (or temperature), and of the energy density that makes it possible to reach this limit, may be performed beforehand, for example by digital simulations. The result obtained by simulation may be experimentally refined.

A method according to the invention may therefore include a preliminary step of determining or estimating the melting limit of the alloy of the semiconductor and of tin (that it is desired to reach by laser annealing), and the corresponding energy density.

Here it is given an example of digital simulation performed in order to evaluate the melting limit, for a stack including:
- a silicon (Si) substrate of thickness 750 µm;
- a germanium (Ge) layer of thickness 2.5 µm;
- a nickel (Ni) layer of thickness 10 nm;

a titanium nitride (TiN) layer of thickness 7 nm.

Figure 2:
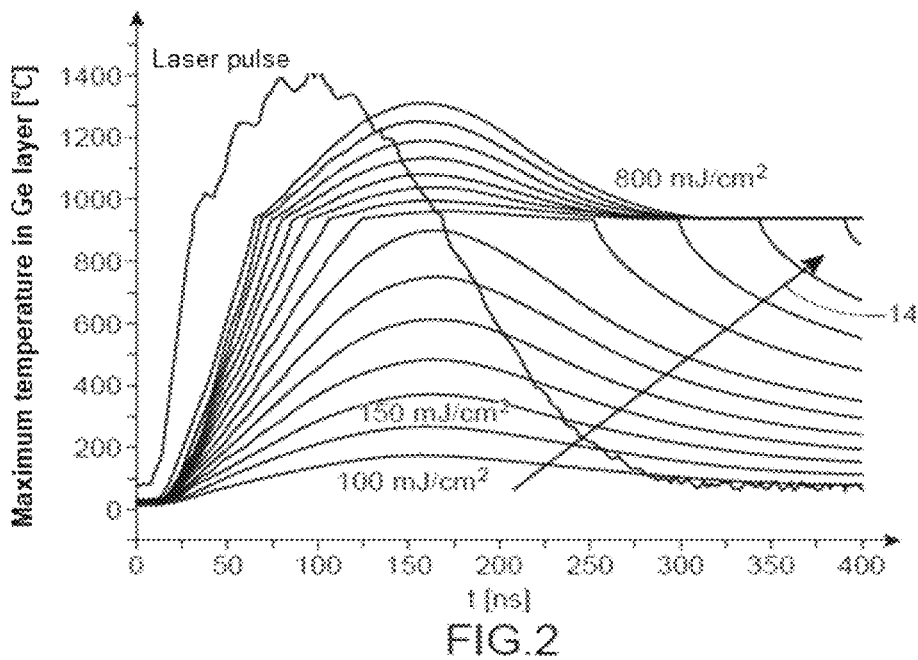
FIG. 2 shows the results of a simulation of a laser treatment of a silicon/germanium/nickel/titanium nitride (Si/Ge/Ni/TiN) stack.

Within the scope of this simulation, it is considered that this stack is subjected to laser annealing, for energy densities between 0.1 J/cm$^2$ and 0.8 J/cm$^2$ (the arrow 15 of FIG. 2 indicates the increasing direction of the energy density). These simulations indicate melting at around 0.4-0.45 J/cm$^2$, limit at which the curves (see FIG. 2) present a plateau. At these values, it is substantially reached the melting temperature of germanium, and contacts may be obtained, the energy of the system being sufficient to make possible the diffusion of tin atoms and the growth of the intermetallic phase. According to these simulations, the energy density range that is of interest is therefore, in this example, substantially between 0.4 J/cm$^2$ and 0.6 J/cm$^2$, which may be experimentally refined. This type of simulation, presented above in the case of a germanium (Ge) layer, may be transposed to the germanium-tin (GeSn) layer; or even, the results above may be experimentally refined for an application to the germanium-tin (GeSn) alloy.

Laser annealing makes it possible, from a stack such as that of FIG. 1A, to produce Ni(GeSn) intermetallic components having very good electrical properties in order to form an ohmic contact whilst maintaining a very good thermal stability and by limiting, or even by eliminating, the segregation phenomenon of tin (Sn).

Figure 3A:
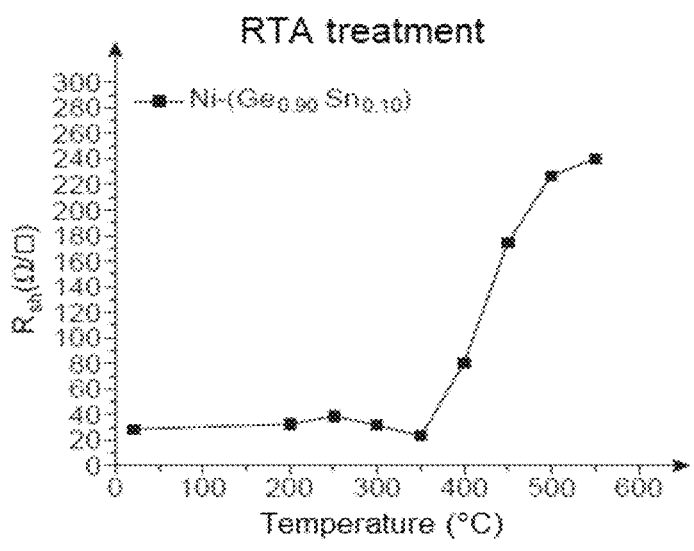
FIGS. 3A and 3B show the evolution of the sheet resistance Rsh for a Ni(GeSn) sample treated by conventional RTA type annealing (FIG. 3A) and by laser annealing (FIG. 3B).
Figure 3B:
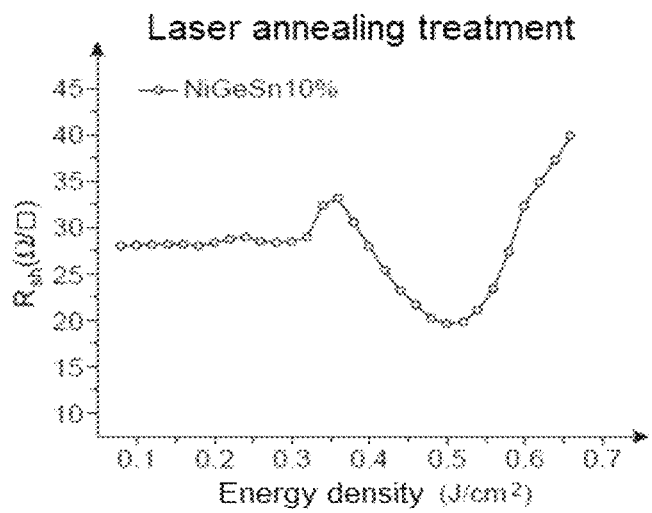

FIGS. 3A and 3B show the evolution of the sheet resistance Rsh for the Ni/GeSn system treated, on the one hand, by conventional RTA type annealing (FIG. 3A) and, on the other hand, by laser annealing (FIG. 3B).

It is noted that the evolution of this electrical parameter is substantially the same for the two samples:
the sheet resistance value first remains stable, at approximately 28-30Ω/□, until a slight increase due to the growth of the nickel-rich phase, at approximately 250° C. for the samples treated by RTA (FIG. 3A) and at approximately 0.34 J/cm$^2$ for the samples treated by laser (FIG. 3B);
subsequently, the sheet resistance reduces to 350° C. for the examples treated by RTA (FIG. 3A) and to approximately 0.5 J/cm$^2$ for the samples treated by laser (FIG. 3B); the reduction of the sheet resistance may be related to the growth of the Ni(GeSn) phase;
finally, the sheet resistance increases from approximately 350° C. for the samples treated by RTA (FIG. 3A) and from approximately 0.54 J/cm$^2$ for the samples treated by laser (FIG. 3B); the increase of the sheet resistance for the samples treated by RTA (FIG. 3A) may be related to the segregation of tin and the agglomeration of the Ni(GeSn) layer, for the samples treated by laser (FIG. 3B) this growth may be related to the degradation of the TiN layer. It should be noted that the value of the resistance reached is not the same for the samples treated by RTA and for the samples treated by laser.

The increase of the sheet resistance is greater for the samples treated by RTA than by laser: in other words, the RTA treatment loses a portion of the conduction properties of the sample that are advantageous for forming an electrical contact.

Concerning the laser treatment (FIG. 3B), an energy density greater than 0.7 J/cm$^2$, in this example, degrades the stack; this is the reason for which the results presented stop at a value slightly lower than this limit. The results presented above relate to a particular example of stack, also the values, ranges and limit(s) indicated may vary for another example of stack.

The evolution illustrated in FIG. 3A is related to the segregation of Sn and its surface distribution, these 2 aspects considerably degrading the electrical properties. Laser annealing makes it possible to form a Ni(GeSn) intermetallic compound without segregation of Sn, which explains the more favourable evolution of the electrical properties (FIG. 3B). Laser annealing also makes it possible to obtain a low resistive contact on a broader range, in terms of energy density, than the RTA treatment, for which there is a single point of operation (above which tin undergoes a segregation).

Figure 4A:
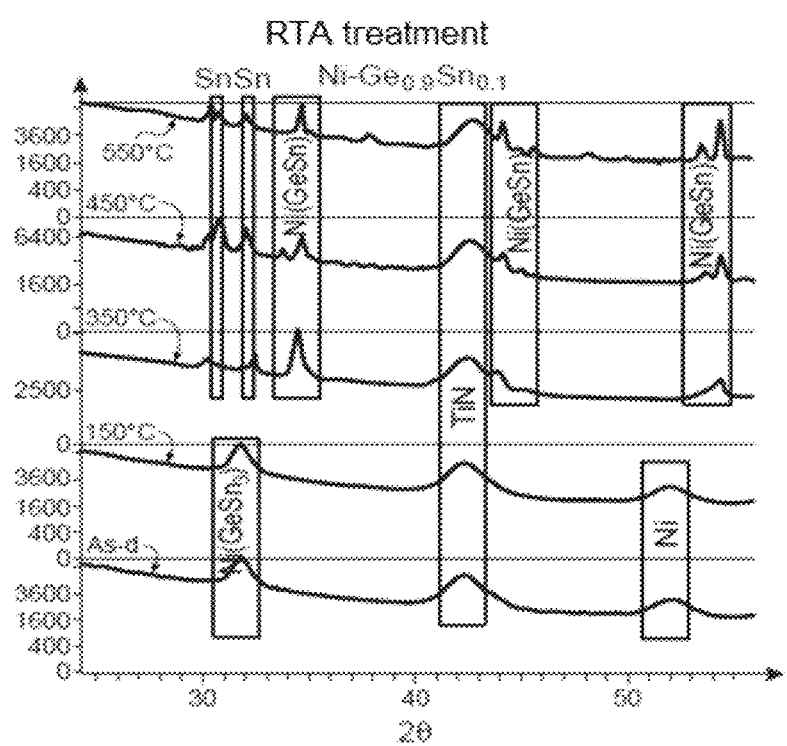

This is confirmed by FIGS. 4A and 4B, which show analysis results in X diffraction (XRD), of type «θ-2θ», between 20° and 90°, by using a copper source in an X-ray diffractometer (of X'Pert Pro PANalytical type). This analysis makes it possible to monitor the crystalline evolution and the formation of phases in the sample. FIGS. 4A and 4B show the evolution of the intensity of the diffraction (along y-axis, arbitrary units) for a Ni/GeSn system treated by conventional RTA type annealing (FIG. 4A) and by laser annealing (FIG. 4B, on which the energy density, in J/cm$^2$ is indicated for each curve, from 0.08 J/cm$^2$ to 0.66 J/cm$^2$).

Therefore, it is seen in these Figures, the evolution of the phases of the Ni/GeSn system in the two treatments. This evolution seems similar, since it is first seen (at low temperature in FIG. 4A and at low energy density in FIG. 4B) the presence of a Ni phase and, fairly rapidly that of a Ni$_5$(GeSn)$_3$ nickel-rich phase. The latter is subsequently consumed during the growth of the Ni(GeSn) phase.

But, for the samples treated by RTA (FIG. 4A), the diffraction peaks related to the β-Sn phase and to the segregation and to the agglomeration of Sn are also observed from 350° C. This peak type is not observed for the samples treated by laser, even at the highest energy density tested (0.66 J/cm$^2$). This segregation of Sn in the case of a RTA treatment poses a problem for producing a quality ohmic contact, not disrupting the operation of the device—particularly if it is of optical type—to which the contact is applied.

Figure 5A:
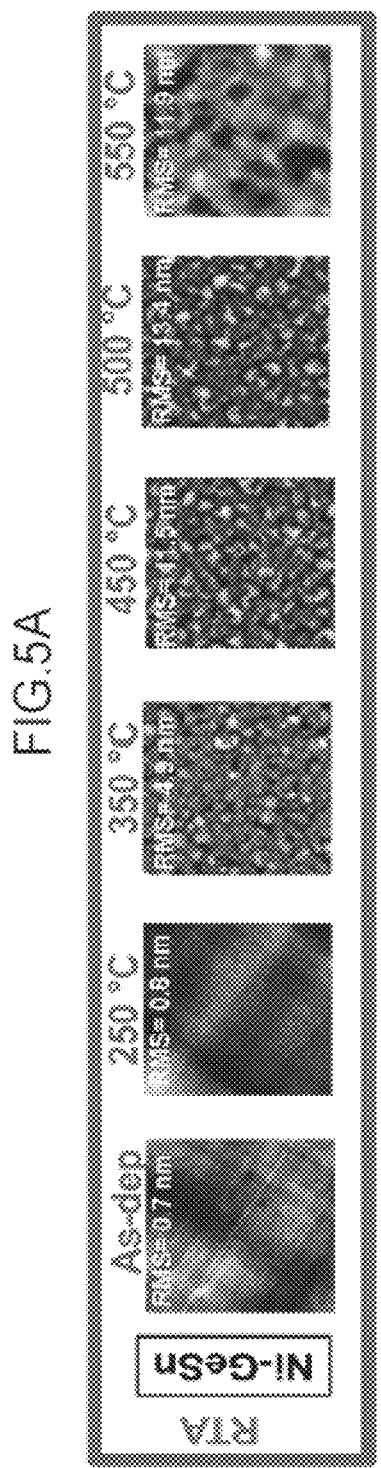
FIGS. 5A and 5B show the morphological evolution of the Ni/GeSn system depending on the evolution of the temperature for a contact obtained by conventional RTA type annealing (FIG. 5A) and for a contact obtained by laser annealing (FIG. 5B).
Figure 5B:
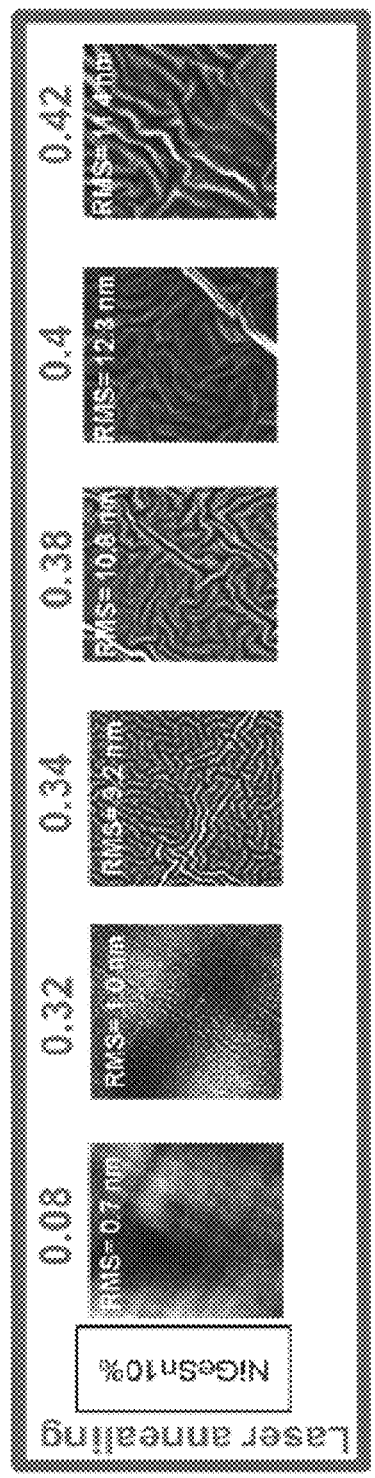

In addition to the agglomeration phenomenon, effects of slotting by grain joints considerably degrade the electrical properties due to the loss of continuity of the layers. Images (5 μm×5 μm) produced by Atomic Force Microscope (AFM), in Tapping mode, with Bruker FastScan type equipment, have made it possible to study the morphological evolution of the surface of the layer 10:
depending on the evolution of the temperature (from 250° C. to 550° C.) for conventional RTA type annealing: FIG. 5A shows this evolution (and that of the roughness, RMS) for 6 samples, one sample of which as deposited (As-dep) and 5 samples, each treated at a temperature (mentioned in FIG. 5A) between 250° C. and 550° C.;
and depending on the energy density (from 0.08 to 0.42 J/cm$^2$) of the pulse laser for laser irradiation annealing: FIG. 5B shows this evolution (and that of the roughness, RMS) for 6 samples, each treated with a single laser pulse, of energy density (mentioned in FIG. 5B) between 0.08 J/cm$^2$ and 0.42 J/cm$^2$, for a concentration of 10% of Sn. Therefore, it is seen in these Figures, the evolution of the phases of the Ni/GeSn system in the two treatments.

Regardless of the system studied, at low temperature (T<300° C.) for the samples treated by RTA, and at low energy density (<0.32 J/cm$^2$) for the samples treated by laser, a cross hatch type pattern of crystallographic orientation <110> is observed. This pattern results from the propagation of dislocations (along the planes (111)). The morphology of the surface is then directly related to the epitaxy of the GeSn layers.

This means that, for the sample as deposited (FIG. 5A, As-dep), the layers based on nickel (Ni) and of titanium nitride (TiN) construction do not modify the morphology of the original surface.

For the systems treated only by RTA (FIG. 5A), this morphology is preserved up to 300° C.; the formation of the nickel-rich phase does not modify the original morphology. As seen in FIG. 5A, the morphology of the surface changes radically at the temperature of 350° C., at which a high increase of the roughness is noted. These modifications are related to the formation of the Ni(GeSn) phase and to its agglomeration.

At temperature higher than 350° C., the roughness gradually increases due to the amplification of two phenomena: the agglomeration of the Ni(GeSn) phase and the segregation of tin (Sn) (highlighted in FIG. 4A). The high increase of the resistance $R_{sh}$ also results from these two phenomena.

For the systems treated by laser (FIG. 5B), the cross hatch type pattern is preserved at low energy density. Beyond 0.34 J/cm$^2$, a modification of the surface morphology is noted: the roughness also increases, because the melting temperature of GeSn has been passed; in addition, folds are observed on this surface, which is due to stress variations in the TiN coating layer (by relaxation of this layer) during the melting of the underlying Ni/GeSn layer. The amplitude of the folds depends on the depth of the melted material: the latter increasing with the energy density, the amplitude of the folds also increases. It should be noted that, in the case of systems treated by laser, these folds generate a significant roughness, but that this does not impact the electrical properties; in addition, the diffraction measurements (FIG. 4B) show that there is no Sn segregation. The tip used to produce the images by AFM interacts firstly with the titanium nitride (TiN) layer, which is significantly modified due to the relaxation of the stresses (already mentioned above). But the Rsh values are not high: the conductivity is therefore good and the Ni(GeSn) layer is probably still continuous, even though the roughness of the titanium nitride (TiN) layer is considerable.

Furthermore, no trace of segregation of tin (Sn) is observed (surface islands have only been observed for the samples treated by RTA).

Consequently, laser annealing makes it possible to obtain a Ni(GeSn) phase, of low resistivity, making it possible to produce a contact on GeSn-based devices, with a reduced thermal budget nevertheless compatible with the formation of this phase. Very good electrical properties are obtained, without segregation of tin Sn at the surface. Given the results of the various examples discussed above (FIGS. 3A-5B), the formation of a very good ohmic contact is, for these examples, obtained for an energy density range deposited by the laser between 0.44 and 0.66 J/cm$^2$.

Figure 6A:
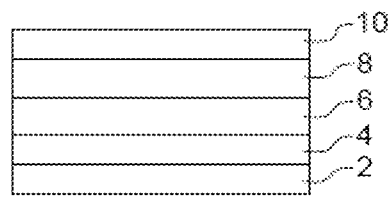
FIGS. 6A and 6C show a variant of a method according to the invention, including laser annealing followed by a RTA treatment.
Figure 6B:
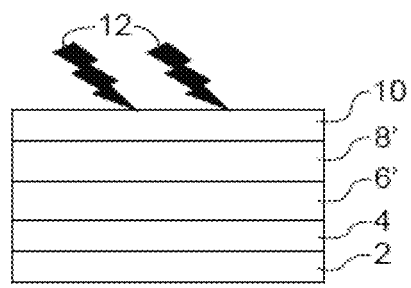
FIG. 6D shows the evolution of the Rsh resistance for a Ni(GeSn) sample treated by laser annealing, without and with post RTA type annealing at low temperature.
Figure 6C:
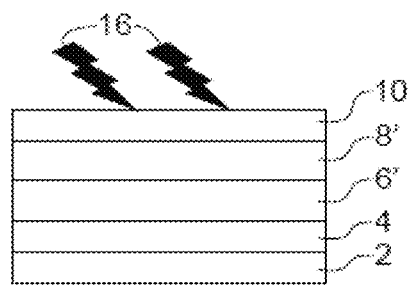

A method according to the invention may be followed by annealing at low temperature, which makes it possible to improve the electrical properties of the ohmic contact obtained by laser annealing, without degrading the surface morphology thereof. Such a method is illustrated schematically in FIGS. 6A-6C. It includes, in this order:
a) epitaxially growing GeSn on a germanium substrate;
b) optionally surface treating with HF;
c) optionally doping the GeSn layer 6 and the germanium substrate 4;
d) depositing nickel (Ni) and titanium nitride (TiN) layers, to form the stack of FIG. 6A;
e) laser annealing (FIG. 6B);
f) rapid annealing at low temperature (FIG. 6C), for example between 150° C. and 250° C.

Steps a)-e) of this method are those already described above.

Figure 6D:
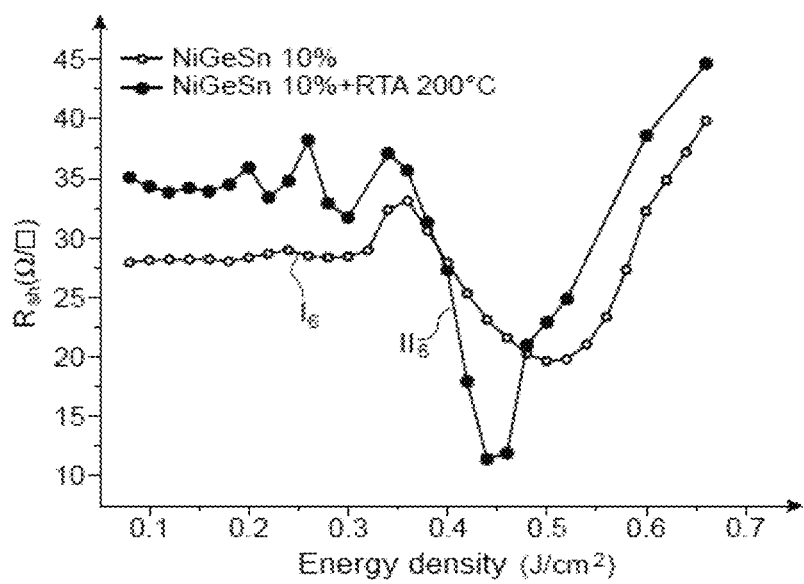

Step f) of annealing at low temperature makes it possible to reduce the resistivity of the contact obtained and to use a lower surface energy density, close to 0.44 J/cm$^2$. Thus, FIG. 6D shows the evolution of the resistance Rsh for the Ni/GeSn system treated by laser annealing without (curve $I_6$) and with (curve $II_6$) post low temperature (200° C.) RTA annealing. It is seen in this Figure that the minimum of the curve $II_6$ is lower than that of the curve $I_6$; in addition, it appears at a lower energy density (approximately 0.44 J/cm$^2$ instead of 0.5 J/cm$^2$)

According to another aspect, pre-amorphisation by implantation of the GeSn layer is performed during the preparation of a stack in view of the implementation of a method according to the invention, during which it is estimated that the melting temperature of GeSn is probably reached (with amorphised Ge). This pre-amorphisation makes it possible to improve the thermal stability of the stack; it uses atomic species such as silicon (Si), germanium (Ge), carbon (C), alone or in combination. The implantation of atomic species of smaller size, such as carbon, which can be better inserted into the structure of Ni$_x$(GeSn)$_y$, alloys and, thus, better block the diffusion and the segregation of tin (Sn) is preferred.

Then, after this pre-amorphisation, the metal layer 8 and the protective layer 10 are formed. Finally, the stack is treated by laser, in accordance with the invention.

Figure 7A:
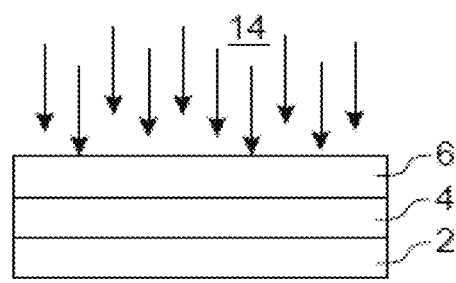
FIGS. 7A-7C show another variant of a method according to the invention, including pre-amorphisation by implantation before metallisation.
Figure 7B:
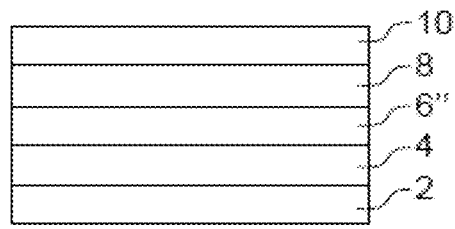
Figure 7C:
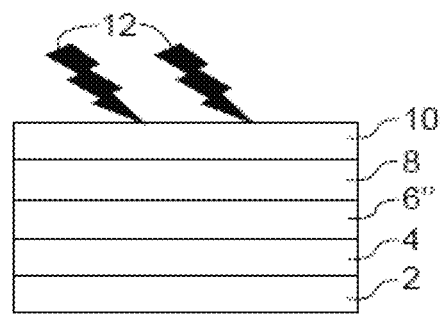

Such a method is illustrated schematically in FIGS. 7A-7C. It includes:
a) —epitaxially growing GeSn 6 on a germanium substrate 4;
b) optionally surface treating with HF;
c) optionally doping the GeSn layer 6 and the germanium substrate 4;
d) pre-amorphisation by implantation 14 (FIG. 7A), the GeSn layer being transformed into an α-GeSn amorphous layer 6";
e) depositing nickel (Ni) 8 and titanium nitride (TiN) 10 layers, to form the stack of FIG. 7B;
f) laser annealing 12 (FIG. 7C) in accordance with the present invention.

Steps a)-c), e), f) of this method are those already described above.

Alternatively, it is possible to perform:
pre-amorphisation by implantation of the GeSn layer, as described above, in relation to FIGS. 7A-7C, by using species such as silicon (Si), germanium (Ge), carbon (C), alone or in combination;
then, after this pre-amorphisation, the metal layer 8 and the protective layer 10 are formed;
then, the stack is treated by laser, in accordance with the invention;
this annealing is followed here by a RTA type treatment at low temperature, as described above, in relation to FIGS. 6A-6C.

Thus, the advantageous effects of the 2 treatments already disclosed above are accumulated (FIGS. 6A-6C, FIGS. 7A-7C).

Figure 8A:
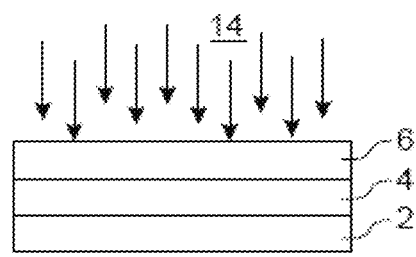
FIGS. 8A-8D also show another variant of a method according to the invention, including pre-amorphisation by implantation before metallisation and RTA type annealing at low temperature post laser annealing.
Figure 8B:
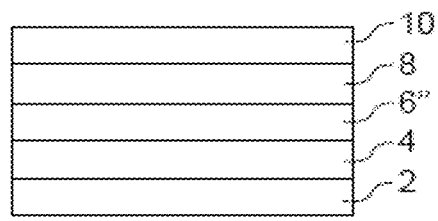
Figure 8C:
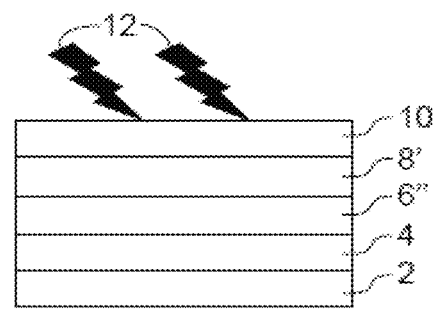
Figure 8D:
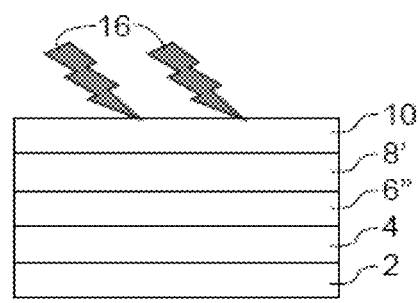

Such a method is illustrated schematically in FIGS. 8A-8D. It includes:
a) —epitaxially growing GeSn 6 on a germanium substrate 4;
b) optionally surface treating with HF;
c) optionally doping the GeSn layer 6 and the germanium substrate 4;

d) pre-amorphisation by implantation 14 (FIG. 8A), the GeSn layer being transformed into an α-GeSn amorphous layer 6";

e) depositing Ni 8 and TiN layers 10 (FIG. 8B);

f) laser annealing (FIG. 8C);

g) thermal annealing at low temperature (FIG. 8D).

These steps a)-g) are those already described above.

The invention has been described for producing a Ni(GeSn) contact, but other ohmic contacts, of type including a metal, a semiconductor and tin, may also be produced, the semiconductor material being for example silicon or germanium, whereas the metal is selected from nickel (Ni), cobalt (Co), titanium (Ti), platinum (Pt), nickel-platinum (NiPt) alloy, nickel-cobalt (NiCo) alloy, tantalum (Ta), tantalum nitride (TaN), titanium nitride (TiN), aluminium (Al), zirconium (Zr), ytterbium (Yb). For each type of contact, it can be determined the melting limit (or temperature) (see the method explained above), and/or the limits of the laser surface energy density range to be applied in order to obtain the desired properties. Analyses such as those presented above for producing a Ni(GeSn) contact may be performed in view of identifying the segregation, or not, of tin (Sn).

The ohmic contacts obtained by the invention are adapted:
- to the production of optical components (for example for laser applications, or applications with sensors in the infrared spectrum);
- to the production of Source-drain type contacts of Ge(Sn) channel CMOS devices.

A contact obtained by a method according to the invention with a structure such as that illustrated in FIG. 1B, 6C, 7D or 8D, the silicon layer 2 forming part of the component on which the contact is produced.

The invention claimed is:

1. A method for producing ohmic contacts, comprising a metal, a semiconductor and tin, the method comprising:
   a) forming a first layer comprising an alloy of the semiconductor and tin;
   b) then, on the first layer, forming a second layer comprising the metal; and
   c) laser annealing at least the first layer at an energy density of from 0.1 to 2 J/cm$^2$, wherein a melting temperature of the alloy of the semiconductor and tin is reached by the laser annealing,
   wherein the method does not produce segregation and agglomeration of tin.

2. The method of claim 1, wherein the semiconductor is silicon or germanium.

3. The method of claim 1, wherein the metal is at least one selected from the group consisting of nickel (Ni), cobalt (Co), titanium (Ti), platinum (Pt), nickel-platinum (NiPt) alloy, nickel-cobalt (NiCo) alloy, tantalum (Ta), tantalum nitride (TaN), titanium nitride (TiN), aluminium (Al), zirconium (Zr), and ytterbium (Yb).

4. The method of claim 1, wherein the energy density of the laser is from 0.44 J/cm$^2$ to 0.7 J/cm$^2$.

5. The method of claim 1, further comprising, after c), rapid thermal annealing at a temperature of from 150° C. and to 250° C.

6. The method of claim 1, comprising between a) and b), amorphising the first layer.

7. The method of claim 6, wherein the amorphisation is obtained by implantation of at least one atomic species.

8. The method of claim 1, further comprising, after b) and before c), forming a protective metal layer.

9. The method of claim 8, wherein the protective metal layer is made of titanium nitride (TiN) or tantalum nitride (TaN).

10. The method of claim 1, wherein the first layer is obtained by epitaxial growth on a substrate of the semiconductor.

11. The method of claim 1, wherein the laser annealing of the first layer has an energy density of from 0.1 to 0.8 J/cm$^2$.

12. The method of claim 1, wherein c) of the laser annealing is performed with the aid of a pulse laser, in at least one pulse.

13. The method of claim 12, wherein the pulse laser has a wavelength lower than 450 nm, a pulse width at mid-height between 10 ns and 300 ns, or a combination thereof.

14. The method of claim 1, further comprising doping the first layer, and optionally a substrate of the semiconductor.

15. The method of claim 1, further comprising preliminary determining or estimating a melting limit of the alloy comprising the semiconductor and tin.

16. The method of claim 1, wherein the first layer and optionally a substrate of the semiconductor is produced on a silicon substrate.

17. The method of claim 16, wherein the silicon substrate forms a part of an optical component or of a CMOS device.

18. The method of claim 7, wherein the at least one atomic species is selected from the group consisting of carbon (C), germanium (Ge), silicon (Si), or a combination thereof.

* * * * *